(12) United States Patent
Kim (10) Patent No.: US 8,999,806 B2
(45) Date of Patent: Apr. 7, 2015

(54) THERMAL TRANSFER METHOD AND METHOD OF MANUFACTURING AN ORGANIC LIGHT EMITTING DISPLAY DEVICE USING THE SAME

(71) Applicant: Samsung Display Co., Ltd., Yongin, Gyeonggi-Do (KR)

(72) Inventor: Dong-Sul Kim, Hwaseong-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/068,882

(22) Filed: Oct. 31, 2013

(65) Prior Publication Data
US 2014/0322848 A1     Oct. 30, 2014

(30) Foreign Application Priority Data

Apr. 30, 2013 (KR) .................. 10-2013-0048274

(51) Int. Cl.
*H01L 51/56* (2006.01)
*H01L 27/32* (2006.01)

(52) U.S. Cl.
CPC ............... *H01L 51/56* (2013.01); *H01L 27/32* (2013.01)

(58) Field of Classification Search
CPC . H01L 51/56; H01L 51/5253; H01L 51/5203; H01L 51/5246; H01L 51/5012; H01L 51/0024; H01L 51/5056; H01L 51/5072; H01L 51/5088; H01L 51/524; H01L 51/5296; H01L 27/3244; H01L 27/32; H01L 27/3258; H01L 2924/0002; H01L 2924/00; H01L 2251/5338; H01L 2251/5361
See application file for complete search history.

(56) References Cited

U.S. PATENT DOCUMENTS

| 5,641,372 | A  | * | 6/1997  | Okuno .......................... 156/230 |
| 6,695,030 | B1 | * | 2/2004  | Phillips et al. ................ 156/540 |
| 8,877,006 | B2 | * | 11/2014 | Ahn .............................. 156/715 |
| 2005/0048295 | A1 |   | 3/2005  | Kim et al. |
| 2005/0184653 | A1 |   | 8/2005  | Suh et al. |
| 2007/0048658 | A1 | * | 3/2007  | Kang et al. .................... 430/201 |
| 2007/0111117 | A1 | * | 5/2007  | Noh et al. ........................ 430/41 |
| 2009/0269509 | A1 | * | 10/2009 | Yokoyama et al. ........... 427/554 |

(Continued)

FOREIGN PATENT DOCUMENTS

| KR | 10-0552964 | 3/2005 |
| KR | 10-0570978 | 8/2005 |

(Continued)

*Primary Examiner* — Bac Au
*Assistant Examiner* — Sophia Nguyen
(74) *Attorney, Agent, or Firm* — Knobbe Martens Olson & Bear LLP (57) ABSTRACT

A thermal transfer method includes a step of forming a donor member having a base layer, a light-to-heat conversion layer disposed on the base layer, an intermediate layer disposed on the light-to-heat conversion layer, an organic transfer layer disposed on the intermediate layer, and a first protecting film disposed over the base layer and contacting at least one edge of the base layer, irradiating a first laser onto the donor member to form a preliminary organic layer on the display substrate, forming a pressing member having a second protecting film and a third protecting film disposed over the second protecting film and contacting at least one edge of the second protecting film, disposing the display substrate within a space formed by the second protecting film and the third protecting film, and irradiating a second laser onto the pressing member to change the preliminary organic layer to an organic layer.

19 Claims, 6 Drawing Sheets

(56) References Cited

U.S. PATENT DOCUMENTS

| | | | |
|---|---|---|---|
| 2011/0003419 A1* | 1/2011 | Noh et al. | 438/35 |
| 2011/0014729 A1* | 1/2011 | Yang et al. | 438/22 |
| 2011/0084286 A1* | 4/2011 | Park et al. | 257/79 |
| 2011/0180203 A1* | 7/2011 | Sun et al. | 156/247 |
| 2012/0270461 A1* | 10/2012 | Kim et al. | 445/24 |

FOREIGN PATENT DOCUMENTS

| | | | |
|---|---|---|---|
| KR | 10-0853542 B1 | | 8/2008 |
| KR | 2010026248 A | * | 3/2010 |

* cited by examiner

THERMAL TRANSFER METHOD AND
METHOD OF MANUFACTURING AN
ORGANIC LIGHT EMITTING DISPLAY
DEVICE USING THE SAME

CROSS-REFERENCE TO RELATED APPLICATIONS

This application claims priority under 35 U.S.C. §119 to Korean patent Application No. 10-2013-0048274, filed on Apr. 30, 2013, the disclosure of which is hereby incorporated by reference herein in its entirety.

BACKGROUND

1. Field

Example embodiments relate generally to a technique for manufacturing an organic light emitting display device. More particularly, embodiments relate to a thermal transfer method, and a method of manufacturing an organic light emitting display device using the thermal transfer method.

2. Description of the Related Technology

An organic light emitting display (OLED) device usually includes various organic layers such as an organic light emitting layer, a hole injection layer, an electron transfer layer, etc. Recently, a laser induced thermal imaging (LITI) process has been developed to form the organic layers of the organic light emitting display device.

In a conventional laser induced thermal imaging process, a donor substrate including organic materials to be transferred onto a display substrate is placed on the display substrate in an atmosphere, and then a laser is irradiated onto the donor substrate to transfer the organic materials onto the display substrate, thereby forming organic layers on the display substrate.

However, the organic transfer layer may not be easily detached or separated from the donor substrate, so that the organic transfer layer may not be precisely transferred onto a desired region of the display substrate.

SUMMARY

Example embodiments provide a thermal transfer method for effectively transferring an organic transfer layer onto a display substrate.

Example embodiments provide a method of manufacturing an organic light emitting display device using the thermal transfer method for effectively transferring an organic transfer layer onto a display substrate.

According to some example embodiments, a thermal transfer method may include a step of forming a donor member having a base layer, a light-to-heat conversion layer disposed on the base layer, an intermediate layer disposed on the light-to-heat conversion layer, an organic transfer layer disposed on the intermediate layer, and a first protecting film disposed over the base layer, the first protecting film making contact with at least one edge of the base layer, disposing a display substrate within a space formed by the base layer and the first protecting film, irradiating a first laser onto the donor member to form a preliminary organic layer on the display substrate, delaminating the display substrate from the donor member, forming a pressing member having a second protecting film and a third protecting film disposed over the second protecting film, the third protecting film making contact with at least one edge of the second protecting film, disposing a display substrate within a space formed by the second protecting film and the third protecting film, and irradiating a second laser onto the pressing member to change the preliminary organic layer to an organic layer.

In some example embodiments, the thermal transfer method may further include a step of removing air from the donor member to laminate the display substrate and the donor member to each other before irradiating the first laser onto the donor member.

In some example embodiments, the thermal transfer method may further include a step of removing air from the pressing member to laminate the display substrate and the pressing member to each other before irradiating the second laser onto the pressing member.

In some example embodiments, the third protecting film may include a monolayer pattern disposed on at least a portion of a bottom surface of the third protecting film, the monolayer pattern being spaced apart from each other and the monolayer pattern may contain a hydrophilic group at an end portion of the monolayer pattern.

In some example embodiments, the third protecting film may include a monolayer pattern disposed on an entire bottom surface of the third protecting film and the monolayer pattern may contain a hydrophilic group at an end portion of the monolayer pattern.

In some example embodiments, the monolayer pattern may make contact with the preliminary organic layer and adhesion strength between the preliminary organic layer and the monolayer pattern may be less than adhesion strength between the preliminary organic layer and the third protecting film except for the monolayer pattern.

In some example embodiments, the monolayer pattern may have a surface tension which is less than or equal to about 6 dyne/cm.

In some example embodiments, the monolayer pattern may be formed by a spray coating process, a slit coating process, a bar coating process, or a spin coating process.

In some example embodiments, the organic transfer layer may include at least one of an organic light emitting layer, a hole injection layer, a hole transport layer, an electron transport layer, and an electron injection layer.

According to some example embodiments, a method of manufacturing an organic light emitting display device using the thermal transfer method may include a step of forming a donor member having a base layer, a light-to-heat conversion layer disposed on the base layer, an intermediate layer disposed on the light-to-heat conversion layer, an organic transfer layer disposed on the intermediate layer, and a first protecting film disposed over the base layer, the first protecting film making contact with at least one edge of the base layer, disposing a display substrate within a space formed by the base layer and the first protecting film, irradiating a first laser onto the donor member to form a preliminary organic layer on the display substrate, delaminating the display substrate from the donor member, forming a pressing member having a second protecting film and a third protecting film disposed over the second protecting film, the third protecting film making contact with at least one edge of the second protecting film, disposing a display substrate within a space formed by the second protecting film and the third protecting film, irradiating a second laser onto the pressing member to change the preliminary organic layer to an organic layer, forming an electron transport layer on the organic layer, and forming a second electrode on the electron transport layer.

In some example embodiments, the method may further include a step of removing air from the donor member to laminate the display substrate and the donor member to each other before irradiating the first laser onto the donor member.

In some example embodiments, the method may further include a step of removing air from the pressing member to laminate the display substrate and the pressing member to each other before irradiating the second laser onto the pressing member.

In some example embodiments, the third protecting film may include a monolayer pattern disposed on at least a portion of a bottom surface of the third protecting film, the monolayer pattern being spaced apart from each other and the monolayer pattern may contain a hydrophilic group at an end portion of the monolayer pattern.

In some example embodiments, the third protecting film may include a monolayer pattern disposed on an entire bottom surface of the third protecting film and the monolayer pattern may contain a hydrophilic group at an end portion of the monolayer pattern.

In some example embodiments, the monolayer pattern may make contact with the preliminary organic layer and adhesion strength between the preliminary organic layer and the monolayer pattern may be less than adhesion strength between the preliminary organic layer and the third protecting film except for the monolayer pattern.

In some example embodiments, the monolayer pattern may have a surface tension which is less than or equal to about 6 dyne/cm.

In some example embodiments, the monolayer pattern may be formed by a spray coating process, a slit coating process, a bar coating process, or a spin coating process.

In some example embodiments, the display substrate may include a first electrode, a pixel defining layer exposing the first electrode, and a hole transport layer disposed on the exposed first electrode.

In some example embodiments, the electron transport layer may be formed by a laser induced thermal imaging process, a nozzle printing process, an inkjet printing process, or an imprinting process.

Therefore, a thermal transfer method according to example embodiments may additionally perform a lamination process using a pressing member that includes a monolayer pattern containing a hydrophilic group at an end portion of the monolayer pattern. As a result, an organic transfer layer may be precisely transferred onto a display substrate. Furthermore, the organic light emitting display device according to example embodiments may have improved luminescent characteristics including, e.g., resolution, contrast, etc.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Various example embodiments will be described more fully hereinafter with reference to the accompanying drawings, in which some example embodiments are shown. The present embodiments may, however, be embodied in many different forms and should not be construed as limited to the example embodiments set forth herein. Rather, these example embodiments are provided so that this disclosure will be thorough and complete, and will fully convey the scope of the present embodiments to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
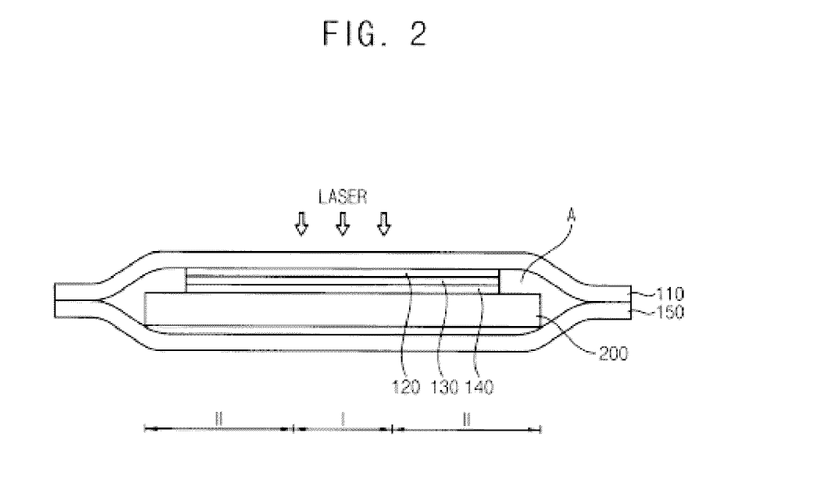
Figure 3:
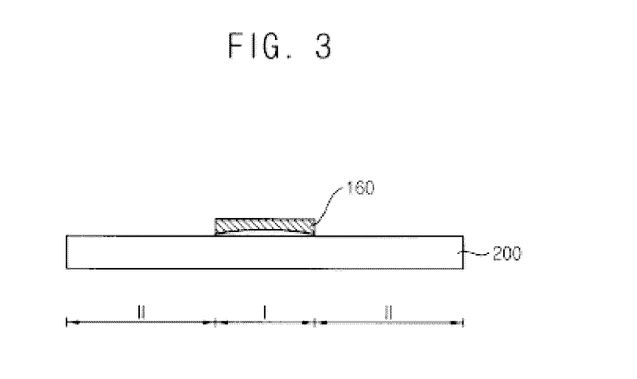
Figure 4A:
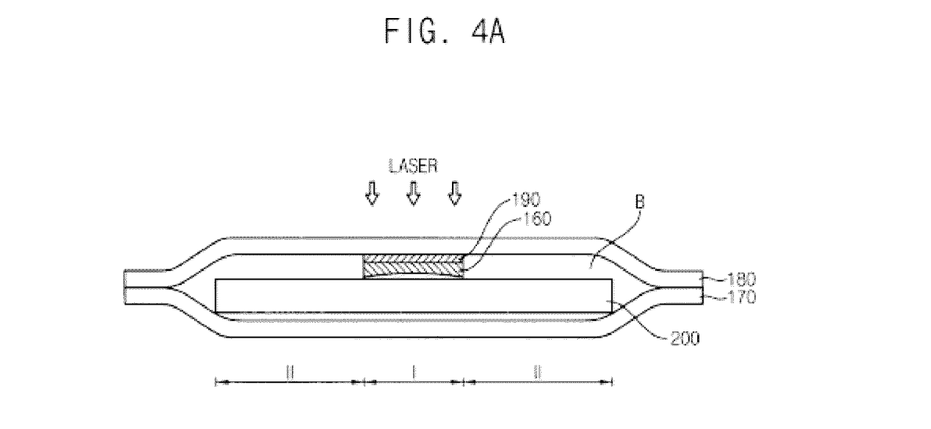
Figure 4B:
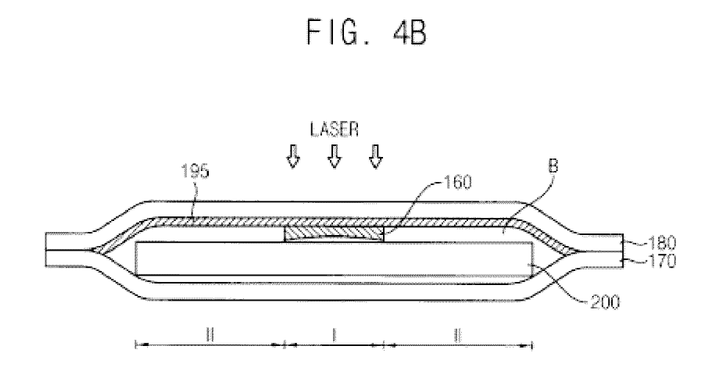

FIGS. 1 through 5 are diagrams illustrating a thermal transfer method in accordance with example embodiments, and FIGS. 4A and 4B are diagrams illustrating a method of manufacturing an organic light emitting display device in accordance with different example embodiments.

Referring to FIGS. 1 through 5, a donor member 100 may include a base layer 110, a light-to-heat conversion layer 120, an intermediate layer 130, an organic transfer layer 140, a first protecting film 150.

Figure 1:
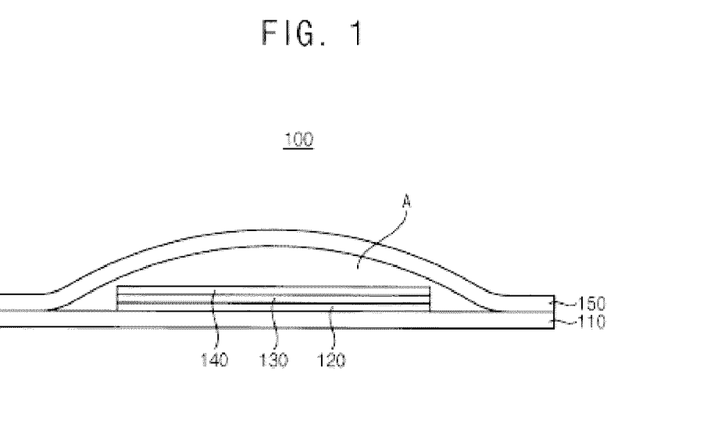
FIGS. 1 through 5 are diagrams illustrating a thermal transfer method in accordance with example embodiments.

The base layer 110 may support the light-to-heat conversion layer 120, the intermediate layer 130, and the organic transfer layer 140. In some example embodiments, the base layer 110 may include a transparent polymer. For example, the base layer 110 may include polyethylene, polystyrene, polyethylene terephthalate, polyester, polyacryl, polyepoxy, etc.

The light-to-heat conversion layer 120 may be disposed on the base layer 110, and may include a light absorption material for converting the energy of the laser beam, which may be irradiated onto the donor member 100, into a thermal energy. The thermal energy generated by the laser beam may reduce adhesion strength between the organic transfer layer 140 and the intermediate layer 130, so that the organic transfer layer 140 may be transferred onto a pixel region I of a display substrate. For example, the light-to-heat conversion layer 120 may include aluminum (Al), molybdenum (Mo), aluminum oxide (AlOx), molybdenum oxide (MoOx), aluminum sulfide (AlSx), molybdenum sulfide (MoSx), etc. Alternatively, the light-to-heat conversion layer 120 may include an organic material to which carbon black, graphite and/or infrared ray dye may be added.

The intermediate layer 130 may be interposed between the light-to-heat conversion layer 120 and the organic transfer layer 140. The intermediate layer 130 may block the diffusion of gas and/or particles generated from the light-to-heat conversion layer 120 into the organic transfer layer 140. Thus, the intermediate layer 130 may prevent the physical and chemical characteristics of the organic transfer layer 140 from being deteriorated. For example, the intermediate layer 130 may include polyimide, polyester, polycarbonate, polyacryl, polyepoxy, polyethylene, polystyrene, polyethylene terephthalate, etc.

The organic transfer layer 140 may be positioned on the intermediate layer 130. In some example embodiments, the organic transfer layer 140 may be separated from the donor member 100 by receiving the thermal energy from the light-to-heat conversion layer 120, so that an organic layer 165 (see FIG. 5) of an organic light emitting display device may be obtained from the organic transfer layer 140.

The organic transfer layer 140 may correspond to an emitting layer (EML) of the organic light emitting display device. The organic transfer layer 140 may additionally include optional organic layers of the organic light emitting display device, for example, a hole injection layer (HIL), a hole transport layer (HTL), an electron injection layer (EIL), an electron transport layer (ETL), etc. The organic transfer layer 140 may have a single layer structure including one of the above-described organic layers or a multi layer structure including at least two of the organic layers. The organic transfer layer 140 may include suitable materials depending on the types of the organic layers included therein.

The first protecting film 150 may be positioned above the base layer 110. That is, the first protecting film 150 may substantially oppose the base layer 110. Additionally, at least one edge of the first protecting film 150 may be attached to the base layer 110. In some example embodiments, the first protecting film 150 may include a transparent resin. For example, the first protecting film 150 may include polyimide, polyester, polycarbonate, polyacryl, polyepoxy, polyethylene, polystyrene, polyethylene terephthalate, etc.

Referring to FIG. 2, a display substrate 200 including a pixel region I and a non-pixel region II may be positioned within a space (A) formed by the base layer 110 and the first protecting film 150. For example, the display substrate 200 may substantially oppose the organic transfer layer 140, and then the donor member 100 and the display substrate 200 may be laminated to each other by removing air from the donor member 100. Accordingly, a substantial vacuum state between the display substrate 200 and the donor member 100 may be uniformly maintained during the laser induced thermal imaging process for forming an organic layer 165 (see FIG. 5) on the display substrate 200. Furthermore, air or a gas may not be trapped between the display substrate 200 and the donor member 100. As a result, deterioration and/or damage of the organic layer 165 (see FIG. 5) caused by the air may be effectively prevented.

As shown in FIG. 2 using arrows, a first laser beam may be irradiated onto the donor member 100 from a light source (not illustrated), so that the organic transfer layer 140 may be transferred onto the pixel region I of the display substrate 200. Accordingly, a preliminary organic transfer layer 160 (see FIG. 3) may be formed on the display substrate 200. In this case, the laser beam may be irradiated onto a portion of the donor member 100 corresponding to the pixel region I of the display substrate 200. For example, the light source may include a laser source, a xenon (Xe) lamp, a flash lamp, etc.

Referring to FIG. 3, the organic transfer layer 140 may be attached to the intermediate layer 130 due to adhesion strength between the organic transfer layer 140 and the intermediate layer 130. In case that the donor member 100 is delaminated from the display substrate 300, the organic transfer layer 140 (i.e., the preliminary organic transfer layer 160) to be transferred onto the display substrate 200 may be attached to the intermediate layer 130 again due to the adhesion strength between the organic transfer layer 140 and the intermediate layer 130. Accordingly, a gap between the display substrate 200 and the preliminary organic layer 160 may be generated by the adhesion strength between the organic transfer layer 140 and the intermediate layer 130.

In some example embodiments, the display substrate 200 having the gap may be delaminated from the donor member 100.

Referring to FIGS. 4A and 4B, a pressing member including a second protecting film 170 and a third protecting film 180 may be provided. In some example embodiments, the third protecting film 180 may be positioned above the second protecting film 170 and may make contact with at least one edge of the second protecting film 170. In some example embodiments, the third protecting film 180 may be positioned above the second protecting film 170, and then at least one edge of the second protecting film 170 making contact with the third protecting film 180 may be heated. The second protecting film 170 and the third protecting film 180 may include substantially the same materials or different materials. For example, the second protecting film 170 and the third protecting film 180 may include polyimide, polyester, polycarbonate, polyacryl, polyepoxy, polyethylene, polystyrene, polyethylene terephthalate, etc.

The display substrate 200 may be positioned within a space (B) formed by the second protecting film 170 and the third protecting film 180. Subsequently, the pressing member and the display substrate 200 may be laminated to each other by removing air from the pressing member.

In some example embodiments, the third protecting film 180 may include a monolayer pattern 190 disposed on at least a portion of a bottom surface of the third protecting film 180 and spaced apart from each other. For example, the monolayer pattern 190 may be formed by a spray coating process, a slit coating process, a bar coating process, or a spin coating process. The monolayer pattern 190 may contain a hydrophilic group at an end portion of the monolayer pattern 190. For example, the monolayer pattern 190 may be formed by using an organic compound having a trifluoride methyl group at the end portion of the organic compound. In this case, the organic compound may include a hydrophilic functional group at the other end portion of the organic compound and the hydrophilic functional group may include an alkyl group. Thus, adhesion strength between the preliminary organic layer 160 and the monolayer pattern 190 may be less than adhesion strength between the preliminary organic layer 160 and the third protecting film 180 except for the monolayer pattern 180. In some example embodiments, the monolayer pattern 190 may preferably have a surface tension which is less than or equal to about 6 dyne/cm.

As shown in FIG. 4A using arrows, a second laser beam may be irradiated onto the pressing member from a light source (not illustrated), so that the preliminary organic transfer layer 160 to be transferred onto the pixel region I of the display substrate 200 may be pressed. Accordingly, a gap between the display substrate 200 and the preliminary organic transfer layer 160 may be eliminated. In this case, the monolayer pattern 190 may substantially oppose the preliminary organic transfer layer 160 and may be spaced apart from the preliminary organic transfer layer 160.

In other example embodiments, the third protecting film 180 may include a monolayer pattern 190 disposed on an entire bottom surface of the third protecting film 180. For example, a monolayer pattern 195 may be formed by a spray coating process, a slit coating process, a bar coating process, or a spin coating process. In this case, the monolayer pattern 190 may contain a hydrophilic group at the end portion of the monolayer pattern 190. For example, the monolayer pattern 190 may be formed by using an organic compound having a trifluoride methyl group at the end portion of the organic compound. In this case, the organic compound may include a hydrophilic functional group at the other end portion of the organic compound and the hydrophilic functional group may include an alkyl group. Thus, adhesion strength between the preliminary organic layer 160 and the monolayer pattern 195 may be less than adhesion strength between the preliminary organic layer 160 and the third protecting film 180 except for the monolayer pattern 180. In some example embodiments, the monolayer pattern 195 may preferably have a surface tension which is less than or equal to about 6 dyne/cm.

As shown in FIG. 4B using arrows, a second laser beam may be irradiated onto the pressing member from a light source (not illustrated), so that the preliminary organic transfer layer 160 to be transferred onto the pixel region I of the display substrate 200 may be pressed. Accordingly, a gap between the display substrate 200 and the preliminary organic transfer layer 160 may be eliminated.

Figure 5:
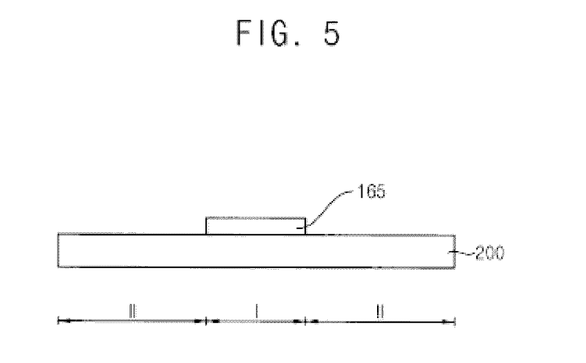

Referring to FIG. 5, an organic layer 165 may be precisely transferred onto a desired region of the display substrate 200 by using the pressing member to eliminate the gap between the display substrate 200 and the preliminary organic layer 160. Here, the organic layer 165 may include a hole injection layer (HIL), a hole transport layer (HTL), an electron injection layer (EIL), an electron transport layer (ETL), etc.

Therefore, a thermal transfer method according to example embodiments may additionally perform a lamination process by using the pressing member. In this case, the pressing member may include the monolayer pattern containing a hydrophilic group at the end portion of the monolayer pattern. As a result, an organic transfer layer may be precisely transferred onto a display substrate. Furthermore, the organic light emitting display device may have improved luminescent characteristics including, e.g., resolution, contrast, etc.

Figure 7:
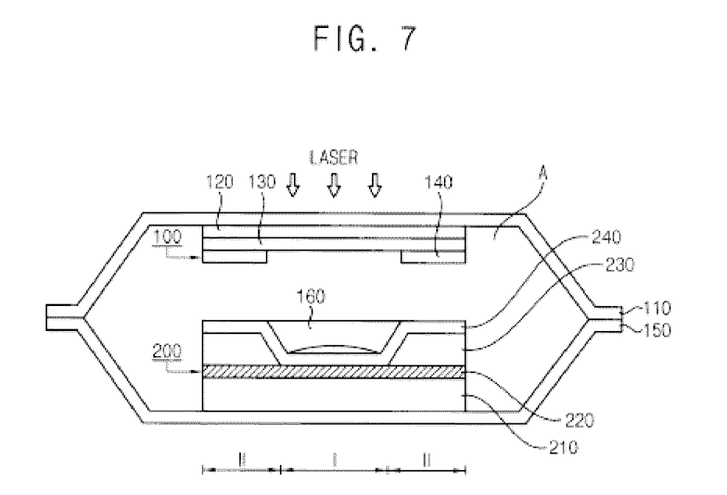
Figure 8:
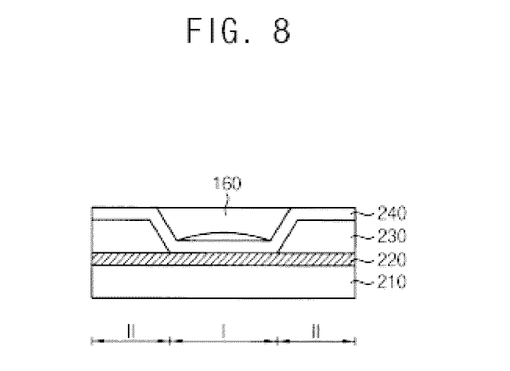
Figure 9A:
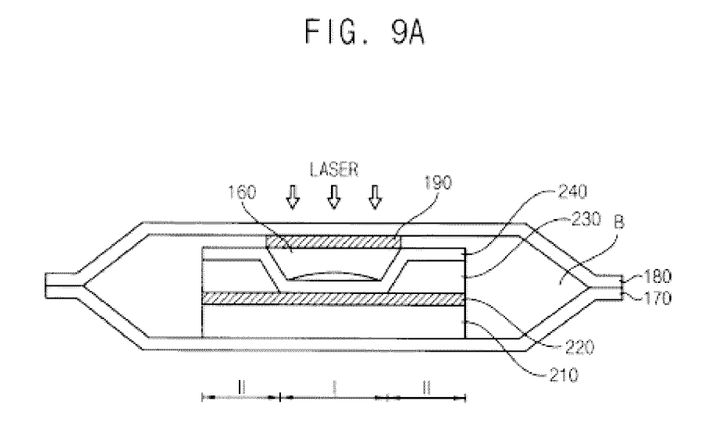
Figure 9B:
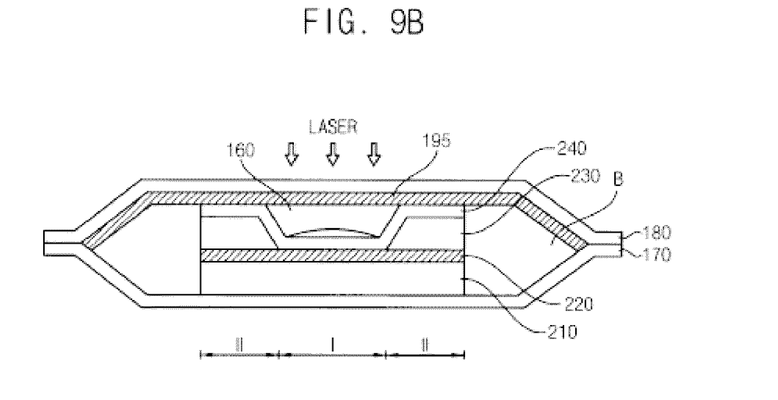

FIGS. 6 through 10 are diagrams illustrating a method of manufacturing an organic light emitting display device using a thermal transfer method in accordance with example embodiments, and FIGS. 9A through 9B are diagrams illustrating a method of manufacturing an organic light emitting display device in accordance with different example embodiments.

Figure 6:
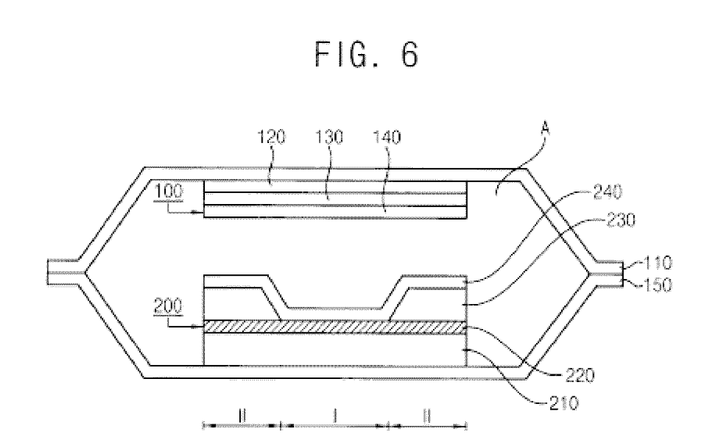
FIGS. 6 through 10 are diagrams illustrating a method of manufacturing an organic light emitting display device using a thermal transfer method in accordance with example embodiments.

Referring to FIG. 6, an organic light emitting display device may include a display substrate 200 having a lower substrate 210, a first electrode 220, a pixel defining layer 230, a hole transfer layer 240, etc.

The lower substrate 210 may include a switching device, an insulation structure, etc. The switching device may have a thin film transistor (TFT) structure or an oxide semiconductor device.

The lower substrate 210 may include a transparent substrate such as a glass substrate, a quartz substrate, a transparent plastic substrate, etc. For example, the lower substrate 210 may include polyimide, polyester, polycarbonate, polyacryl, polyepoxy, polyethylene, polystyrene, polyethylene terephthalate, etc. A buffer layer (not illustrated) may be disposed on the lower substrate 210. In some example embodiments, the buffer layer may prevent diffusion of metal atoms and/or impurities from the lower substrate 210. In case that the lower substrate 210 may have a relatively irregular surface, the buffer layer may improve flatness of the surface of the lower substrate 210.

The buffer layer may be formed using a silicon compound. For example, the buffer layer may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. The buffer layer may be formed by a spin coating process, a chemical vapor deposition (CVD) process, a plasma enhanced chemical vapor deposition (PECVD) process, a high density plasma-chemical vapor deposition (HDP-CVD) process, a printing process, etc. The buffer layer may have a single layer structure or a multi layer structure. For example, the buffer layer may have a single layer structure including a silicon oxide film, a silicon nitride film, a silicon oxynitride film, a silicon oxycarbide film, or a silicon carbon nitride film. Alternatively, the buffer layer may have a multi layer structure including at least two of a silicon oxide film, a silicon nitride film, a silicon oxynitride film, a silicon oxycarbide film, a silicon carbon nitride film, etc.

The first electrode 220 may be formed using a transparent conductive material, e.g., indium tin oxide (ITO), zinc tin oxide (ZTO), indium zinc oxide (IZO), zinc oxide (ZnOx), tin oxide (SnOx), etc. The first electrode 220 may be obtained by a sputtering process, an atomic layer deposition (ALD) process, a vacuum evaporation process, a printing process, etc.

The pixel defining layer 230 may be formed on the first electrode 220. In some example embodiments, a photosensitive material layer (not illustrated) including, e.g., acryl-based resin, polyimide, BCB, etc., may be formed on the first electrode 220. The photosensitive material layer may be selectively exposed to light using an exposure mask, and then an exposed portion of the photosensitive material layer may be removed by a developing process to form the pixel defining layer 230. Alternatively, a non-photosensitive organic material layer or an inorganic material layer may be formed on the first electrode 220, and then the non-photosensitive organic material layer or the inorganic material layer may be partially etched to form the pixel defining layer 230. By forming the pixel defining layer 230, a pixel region I of the organic light emitting display device and a non-pixel region II of the organic light emitting display device may be defined. A portion of the first electrode 220 exposed by the pixel defining layer 230 may be located in the pixel region I. The pixel defining layer 230 and a remaining portion of the first electrode 220 may be located in the non-pixel region II.

The hole transport layer 240 may be formed using a hole transport material, e.g., NPB, TPD, α-NPD, N-phenylcarbazole, polyvinylcarbazole, etc. The hole transport layer 240 may be obtained by a vacuum evaporation process, a thermal evaporation process, a slit coating process, a spin coating process, a whole surface printing process, etc.

Referring now to FIG. 6, a display substrate 200 may be positioned within a space (A) formed by the base layer 110 and the first protecting film 150. For example, the display substrate 200 may substantially oppose the organic transfer layer 140 of the donor member 100, and then the donor member 100 and the display substrate 200 may be laminated to each other by removing air from the donor member 100. Accordingly, a substantial vacuum state between the display substrate 200 and the donor member 100 may be uniformly maintained in the laser induced thermal imaging process for forming an organic layer 165 (see FIG. 10) on the display substrate 200. Furthermore, air or a gas may not be trapped between the display substrate 200 and the donor member 100. As a result, deterioration and/or damage of the organic layer 165 (see FIG. 10) caused by the air may be effectively prevented.

As shown in FIG. 7 using arrows, a first laser beam may be irradiated onto the donor member 100 from a light source (not illustrated), so that the organic transfer layer 140 of the donor member 100 may be transferred onto a hole transfer layer 140 of the pixel region I of the display substrate 200. Accordingly, a preliminary organic transfer layer 160 may be formed on the hole transfer layer 140. In this case, the laser beam may be irradiated onto a portion of the donor member 100 corresponding to the pixel region I of the display substrate 200. In some example embodiments, the laser beam may be selectively irradiated onto the donor member 100 by using a mask. In this case, the mask may include a light-transmitting portion corresponding to the pixel region I and a light-blocking portion corresponding to the non-pixel region II. For example, the light source may include a laser source, a xenon (Xe) lamp, a flash lamp, etc.

In some example embodiments, the organic transfer layer 140 may be attached to the intermediate layer 130 due to adhesion strength between the organic transfer layer 140 and the intermediate layer 130. In case that the organic transfer layer 140 is transferred onto the pixel region I of the display substrate 200, and then the donor member 100 is delaminated from the display substrate 200, the organic transfer layer 140 (i.e., the preliminary organic transfer layer 160) to be transferred onto the display substrate 200 may be attached to the intermediate layer 130 again due to the adhesion strength between the organic transfer layer 140 and the intermediate layer 130. Accordingly, a gap between the display substrate 200 and the preliminary organic layer 160 may be generated by the adhesion strength between the organic transfer layer 140 and the intermediate layer 130.

In some example embodiments, the display substrate 200 having the gap may be delaminated from the donor member 100.

Referring to FIGS. 9A and 9B, a pressing member including a second protecting film 170 and a third protecting film 180 may be provided. In some example embodiments, the third protecting film 180 may be positioned above the second protecting film 170 and may make contact with at least one edge of the second protecting film 170. In some example embodiments, the third protecting film 180 may be positioned above the second protecting film 170, and then at least one edge of the second protecting film 170 making contact with the third protecting film 180 may be heated, thereby forming the pressing member. In this case, the display substrate 200 may be positioned within a space (B) formed by the second protecting film 170 and the third protecting film 180. Subsequently, the pressing member and the display substrate 200 may be laminated to each other by removing air from the pressing member.

In some example embodiments, the third protecting film 180 may include a monolayer pattern 190 disposed on at least a portion of a bottom surface of the third protecting film 180 and spaced apart from each other. For example, the monolayer pattern 190 may be formed by a spray coating process, a slit coating process, a bar coating process, or a spin coating process. In this case, the monolayer pattern 190 may contain a hydrophilic group at an end portion of the monolayer pattern 190. For example, the monolayer pattern 190 may be formed by using an organic compound having a trifluoride methyl group at an end portion of the organic compound. In this case, the organic compound may include a hydrophilic functional group at the other end portion of the organic compound and the hydrophilic functional group may include an alkyl group. Thus, adhesion strength between the preliminary organic layer 160 and the monolayer pattern 190 may be less than adhesion strength between the preliminary organic layer 160 and the third protecting film 180 except for the monolayer pattern 180. In some example embodiments, the monolayer pattern 190 may preferably have a surface tension which is less than or equal to about 6 dyne/cm.

As shown in FIG. 9A using arrows, a second laser beam may be irradiated onto the pressing member from a light source (not illustrated), so that the preliminary organic transfer layer 160 to be transferred onto the pixel region I of the display substrate 200 may be pressed. Accordingly, a gap between the display substrate 200 and the preliminary organic transfer layer 160 may be eliminated. In this case, the monolayer pattern 190 may substantially oppose the preliminary organic transfer layer 160 and may be spaced apart from the preliminary organic transfer layer 160.

In other example embodiments, the third protecting film 180 may include a monolayer pattern 190 disposed on an entire bottom surface of the third protecting film 180. For example, a monolayer pattern 195 may be formed by a spray coating process, a slit coating process, a bar coating process, or a spin coating process. In this case, the monolayer pattern 190 may contain a hydrophilic group at the end portion of the monolayer pattern 190. For example, the monolayer pattern 190 may be formed by using an organic compound having a trifluoride methyl group at the end portion of the organic compound. In this case, the organic compound may include a hydrophilic functional group at the other end portion of the organic compound and the hydrophilic functional group may include an alkyl group. Thus, adhesion strength between the preliminary organic layer 160 and the monolayer pattern 195 may be less than adhesion strength between the preliminary organic layer 160 and the third protecting film 180 except for the monolayer pattern 180. In some example embodiments, the monolayer pattern 195 may preferably have a surface tension which is less than or equal to about 6 dyne/cm.

As shown in FIG. 9B using arrows, a second laser beam may be irradiated onto the pressing member from a light source (not illustrated), so that the preliminary organic transfer layer 160 to be transferred onto the pixel region I of the display substrate 200 may be pressed. Accordingly, a gap between the display substrate 200 and the preliminary organic transfer layer 160 may be eliminated.

Therefore, a thermal transfer method according to example embodiments may additionally perform a lamination process by using the pressing member that includes the monolayer pattern. As a result, an organic transfer layer may be precisely transferred onto a display substrate. Furthermore, the organic light emitting display device may have improved luminescent characteristics including, e.g., resolution, contrast, etc.

Figure 10:
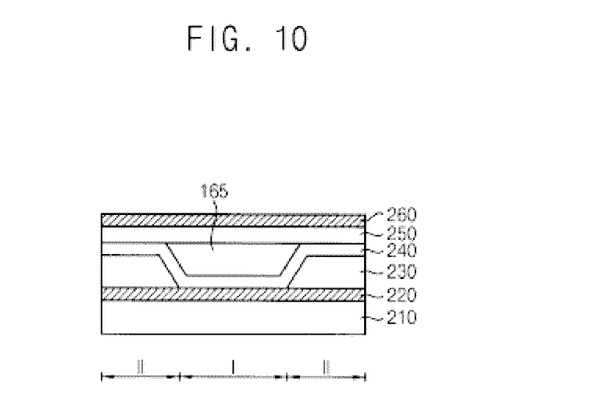

Referring to FIG. 10, the gap between the display substrate 200 and the preliminary organic layer 160 may be eliminate by using the pressing member, so that an organic layer 165 may be precisely transferred onto a desired region of the display substrate 200. A electron transfer layer 250 may be formed on the hole transfer layer 240 and the organic layer 165, and then a second electrode 260 may be formed on the electron transfer layer 250. For example, the electron transfer layer 250 may be formed using a electron transfer material, e.g., tris(8-quinolinolate)aluminum (Alq), 2-(4-biphenylyl)-5-(4-tert-butylphenyl)-1,3,4-oxadiazole (PBD) 3-(4-tert-butylphenyl)-4-phenyl-5-(4-biphenylyl)-1,2,4-triazole (TAZ), rubrene, etc. The electron transfer layer 250 may be obtained by a laser induced thermal imaging process, a nozzle printing process, an inkjet printing process, or an imprinting process, etc.

The second electrode 260 may be formed using a transparent conductive material, e.g., indium tin oxide (ITO), zinc tin oxide (ZTO), indium zinc oxide (IZO), zinc oxide (ZnOx), tin oxide (SnOx), etc. The first electrode 220 may be obtained by a sputtering process, an atomic layer deposition (ALD) process, a vacuum evaporation process, a printing process, etc.

In other example embodiment, an electron injection layer (not illustrated) may be further disposed between the electron transfer layer 250 and the second electrode 260. For example, the electron injection layer of the organic transfer layer may include a low molecular weight material, e.g., Alq3, gallium complex, PBD, etc. or a high molecular weight material, e.g., oxadiazol-type high molecular weight material.

Additionally, a protection layer (not illustrated) and an upper substrate (not illustrated) may be formed on the second electrode 250 to obtain the organic light emitting display device according to example embodiments.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present embodiments. Accordingly, all such modifications are intended to be included within the scope of the present embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A thermal transfer method, the method comprising:
   forming a donor member having a base layer,
   forming a light-to-heat conversion layer on the base layer,
   forming an intermediate layer on the light-to-heat conversion layer,
   forming an organic transfer layer on the intermediate layer, and
   forming a first protecting film over the base layer,
   wherein the first protecting film makes contact with at least one edge of the base layer;
   disposing a display substrate within a space formed by the base layer and the first protecting film;
   irradiating a first laser onto the donor member to form a preliminary organic layer on the display substrate;
   delaminating the display substrate from the donor member;
   forming a pressing member having a second protecting film and a third protecting film disposed over the second protecting film,
   wherein the third protecting film makes contact with at least one edge of the second protecting film;
   disposing the display substrate within a space formed by the second protecting film and the third protecting film; and
   irradiating a second laser onto the pressing member to change the preliminary organic layer to an organic layer.

2. The thermal transfer method of claim 1, further comprising:
   removing air from the donor member to laminate the display substrate and the donor member to each other before irradiating the first laser onto the donor member.

3. The thermal transfer method of claim 1, further comprising:
   removing air from the pressing member to laminate the display substrate and the pressing member to each other before irradiating the second laser onto the pressing member.

4. The thermal transfer method of claim 1,
   wherein the third protecting film includes a monolayer pattern disposed on at least a portion of a bottom surface of the third protecting film, the monolayer pattern being spaced apart from each other, and
   wherein the monolayer pattern contains a hydrophilic group at an end portion of the monolayer pattern.

5. The thermal transfer method of claim 1,
   wherein the third protecting film includes a monolayer pattern disposed on an entire bottom surface of the third protecting film, and
   wherein the monolayer pattern contains a hydrophilic group at an end portion of the monolayer pattern.

6. The thermal transfer method of claim 5,
   wherein the monolayer pattern makes contact with the preliminary organic layer, and
   wherein adhesion strength between the preliminary organic layer and the monolayer pattern is less than adhesion strength between the preliminary organic layer and the third protecting film except for the monolayer pattern.

7. The thermal transfer method of claim 6, wherein the monolayer pattern has a surface tension less than or equal to about 6 dyne/cm.

8. The thermal transfer method of claim 7, wherein the monolayer pattern is formed by a spray coating process, a slit coating process, a bar coating process, or a spin coating process.

9. The thermal transfer method of claim 1, wherein the organic transfer layer includes at least one of an organic light emitting layer, a hole injection layer, a hole transport layer, an electron transport layer, and an electron injection layer.

10. A method of manufacturing an organic light emitting display device, the method comprising:
    forming a donor member having a base layer,
    forming a light-to-heat conversion layer on the base layer,
    forming an intermediate layer on the light-to-heat conversion layer,
    forming an organic transfer layer on the intermediate layer, and
    forming a first protecting film over the base layer,
    wherein the first protecting film makes contact with at least one edge of the base layer;
    disposing a display substrate within a space formed by the base layer and the first protecting film;
    irradiating a first laser onto the donor member to form a preliminary organic layer on the display substrate;
    delaminating the display substrate from the donor member;
    forming a pressing member having a second protecting film and a third protecting film disposed over the second protecting film,
    wherein the third protecting film makes contact with at least one edge of the second protecting film;
    disposing the display substrate within a space formed by the second protecting film and the third protecting film;

irradiating a second laser onto the pressing member to change the preliminary organic layer to an organic layer;

forming an electron transport layer on the organic layer; and forming a second electrode on the electron transport layer.

11. The method of claim 10, further comprising:

removing air from the donor member to laminate the display substrate and the donor member to each other before irradiating the first laser onto the donor member.

12. The method of claim 10, further comprising:

removing air from the pressing member to laminate the display substrate and the pressing member to each other before irradiating the second laser onto the pressing member.

13. The method of claim 10, wherein the third protecting film includes a monolayer pattern disposed on at least a portion of a bottom surface of the third protecting film, the monolayer pattern being spaced apart from each other, and wherein the monolayer pattern contains a hydrophilic group at an end portion of the monolayer pattern.

14. The method of claim 10, wherein the third protecting film includes a monolayer pattern disposed on an entire bottom surface of the third protecting film, and wherein the monolayer pattern contains a hydrophilic group at an end portion of the monolayer pattern.

15. The method of claim 14, wherein the monolayer pattern makes contact with the preliminary organic layer, and wherein adhesion strength between the preliminary organic layer and the monolayer pattern is less than adhesion strength between the preliminary organic layer and the third protecting film except for the monolayer pattern.

16. The method of claim 15, wherein the monolayer pattern has a surface tension less than or equal to about 6 dyne/cm.

17. The method of claim 16, wherein the monolayer pattern is formed by a spray coating process, a slit coating process, a bar coating process, or a spin coating process.

18. The method of claim 10, wherein the display substrate includes a first electrode, a pixel defining layer exposing the first electrode, and a hole transport layer disposed on the exposed first electrode.

19. The method of claim 10, wherein the electron transport layer is formed by a laser induced thermal imaging process, a nozzle printing process, an inkjet printing process, or an imprinting process.

* * * * *